United States Patent
Zhang et al.

(10) Patent No.: US 8,111,037 B2
(45) Date of Patent: Feb. 7, 2012

(54) METHOD FOR BATTERY STATE-OF-HEALTH MONITORING USING BATTERY VOLTAGE DURING VEHICLE STARTING

(75) Inventors: Xiaodong Zhang, Mason, OH (US); Nick S. Kapsokavathis, Shelby Township, MI (US); Yilu Zhang, Northville, MI (US); David W. Walters, Sterling Heights, MI (US); Xidong Tang, Sterling Heights, MI (US); Mutasim A. Salman, Rochester Hills, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 728 days.

(21) Appl. No.: 12/147,552

(22) Filed: Jun. 27, 2008

(65) Prior Publication Data
US 2009/0322340 A1    Dec. 31, 2009

(51) Int. Cl.
*H02J 7/14* (2006.01)
*H02J 7/00* (2006.01)
*G01N 27/416* (2006.01)
*H04B 1/38* (2006.01)

(52) U.S. Cl. ........ 320/104; 320/108; 320/132; 320/134; 320/135; 324/426; 324/427; 455/573

(58) Field of Classification Search ............... 320/104, 320/108, 11, 134, 132, 135, 136; 324/436, 324/437; 455/573, 575.1, 90.3; 348/373; 396/205
See application file for complete search history.

(56) References Cited

U.S. PATENT DOCUMENTS

| | | | |
|---|---|---|---|
| 4,731,601 A | 3/1988 | Nowakowski et al. | |
| 6,472,875 B1 | 10/2002 | Meyer | |
| 7,116,078 B2 * | 10/2006 | Colombo et al. | 320/104 |
| 7,446,510 B2 * | 11/2008 | Chou et al. | 320/156 |
| 7,652,449 B2 * | 1/2010 | Tae et al. | 320/104 |
| 7,679,328 B2 * | 3/2010 | Mizuno et al. | 320/132 |
| 7,888,912 B2 * | 2/2011 | Morita et al. | 320/132 |
| 2004/0119441 A1 * | 6/2004 | Koo | 320/104 |
| 2004/0232884 A1 * | 11/2004 | Vaillancourt et al. | 320/132 |
| 2007/0182385 A1 * | 8/2007 | Ueda et al. | 323/211 |
| 2007/0252584 A1 * | 11/2007 | Imamura et al. | 324/158.1 |
| 2010/0327809 A1 * | 12/2010 | Takaoka et al. | 320/118 |

OTHER PUBLICATIONS

Journal of Power Sources, Impedance Measurements on Lead-Acid Batteries for State-of-Charge, State-of-Health and Cranking Capability Prognosis in Electric and Hybrid Electric Vehicles, Holger Blanke, et al, pp. 418-425, 2004.

* cited by examiner

*Primary Examiner* — Melissa Koval
*Assistant Examiner* — Alexis Boateng

(57) ABSTRACT

A method is provided for determining a battery's state-of-health. An initial battery voltage is measured after a first voltage drop during an initiation of an engine cranking phase. A battery voltage is monitored during the remainder of the engine cranking phase. A lowest battery voltage is determined during the remainder of the engine cranking phase. A determination is made if a voltage difference between the lowest battery voltage and the initial battery voltage at the initiation of the engine cranking phase is less than a voltage threshold. A low battery state-of-health is identified in response to the voltage difference being less than the voltage threshold.

15 Claims, 2 Drawing Sheets

METHOD FOR BATTERY STATE-OF-HEALTH MONITORING USING BATTERY VOLTAGE DURING VEHICLE STARTING

BACKGROUND OF INVENTION

The present invention relates generally to monitoring a battery's state-of-health.

A vehicle's electrical power supply system must support a plurality of vehicle functions that operate on electrical energy. Such functions include normal vehicle operation devices and safety related devices such as rear window defogger, anti-lock braking/stability systems, lighting systems, etc. In addition to these devices, the vehicle's electrical power supply system also supports comfort, convenience, and entertainment devices. Some examples include air conditioning, heated seats, video/audio systems, and accessory outlet convenience devices. Moreover, with the advent of new X-by-wire technologies (e.g., steer-by-wire, brake-by-wire, etc.), even more electrical power must be demanded of the vehicle's electrical power system. As a result, the increasing electrical power demands from various vehicle electrical devices shorten the useful life of vehicle batteries.

The drain on the battery is related to not only the number of electrical devices used, but also the electrical draw and usage of such electrical devices. Therefore, on-board battery state monitoring systems attempt to determine when a battery may fail. On-board vehicle state-of-health (SOH) information is typically derived from model parameters of an equivalent circuit battery model, which requires the use of a costly current sensor needed to measure high current during cranking. These methods use constant thresholds on selected battery model parameters to determine battery end-of-life, but the calibration of such constant thresholds is complicated due to the variations of battery types, vehicle starting systems, and operating environment.

SUMMARY OF INVENTION

An advantage of an embodiment provides for simple and cost-effective method and apparatus of monitoring battery state-of-health and determining battery end-of-life based on respective features of battery voltage signal during vehicle starting.

An embodiment contemplates a method of determining battery state-of-health. An initial battery voltage, V1, is measured at a first voltage drop corresponding to starter engagement upon initiation of an engine cranking phase. The battery voltage is monitored during the remainder of the engine cranking phase. A lowest battery voltage, V2, is determined during the remainder of the engine cranking phase. A determination is made if a voltage difference between the lowest battery voltage V2 and the initial battery voltage V1 at the initiation of the engine cranking phase is less than a voltage threshold. A low battery state-of-health is identified in response to the voltage difference being less than the voltage threshold.

An embodiment contemplates a method of determining a battery's state-of-health. An initial battery voltage, V1, is measured at the instant of starter engagement upon initiation of the engine cranking phase. A first voltage peak is determined during the engine cranking phase. A lowest voltage, V2, is determined between a time interval when the first voltage peak is detected and completion of the engine cranking phase. A voltage difference is determined between the lowest voltage and the initial battery voltage. The voltage difference is compared to a voltage threshold. A determination is made that the battery has a low battery state-of-health if the voltage difference is less than the voltage threshold. A control action is performed to identify the low battery state-of-health in response to the voltage difference being less than the voltage threshold.

DETAILED DESCRIPTION

A power supply system includes a power source, such as the vehicle battery, for maintaining stored energy for energizing various vehicle electrical systems and components. While the power supply system may include additional power generating components (e.g., an alternator) for increasing the power provided to the vehicle systems and components while the engine is operating, the vehicle battery is primarily responsible for providing power to start the vehicle during an engine cranking phase.

A vehicle starting system typically includes, but is not limited to, the vehicle battery, a starter motor, and an ignition switch. When the ignition key is inserted within the ignition switch and turned to a start position, power energizes a solenoid coil within the starter which results in a starter pinion engaging a flywheel of an engine. The pinion of the starter motor drives the flywheel for starting the engine of the vehicle. When the engine is started, the ignition key is released and the pinion of the starter motor retracts from the flywheel thereby terminating the engine cranking phase. This is known as the engine cranking phase.

Figure 1:
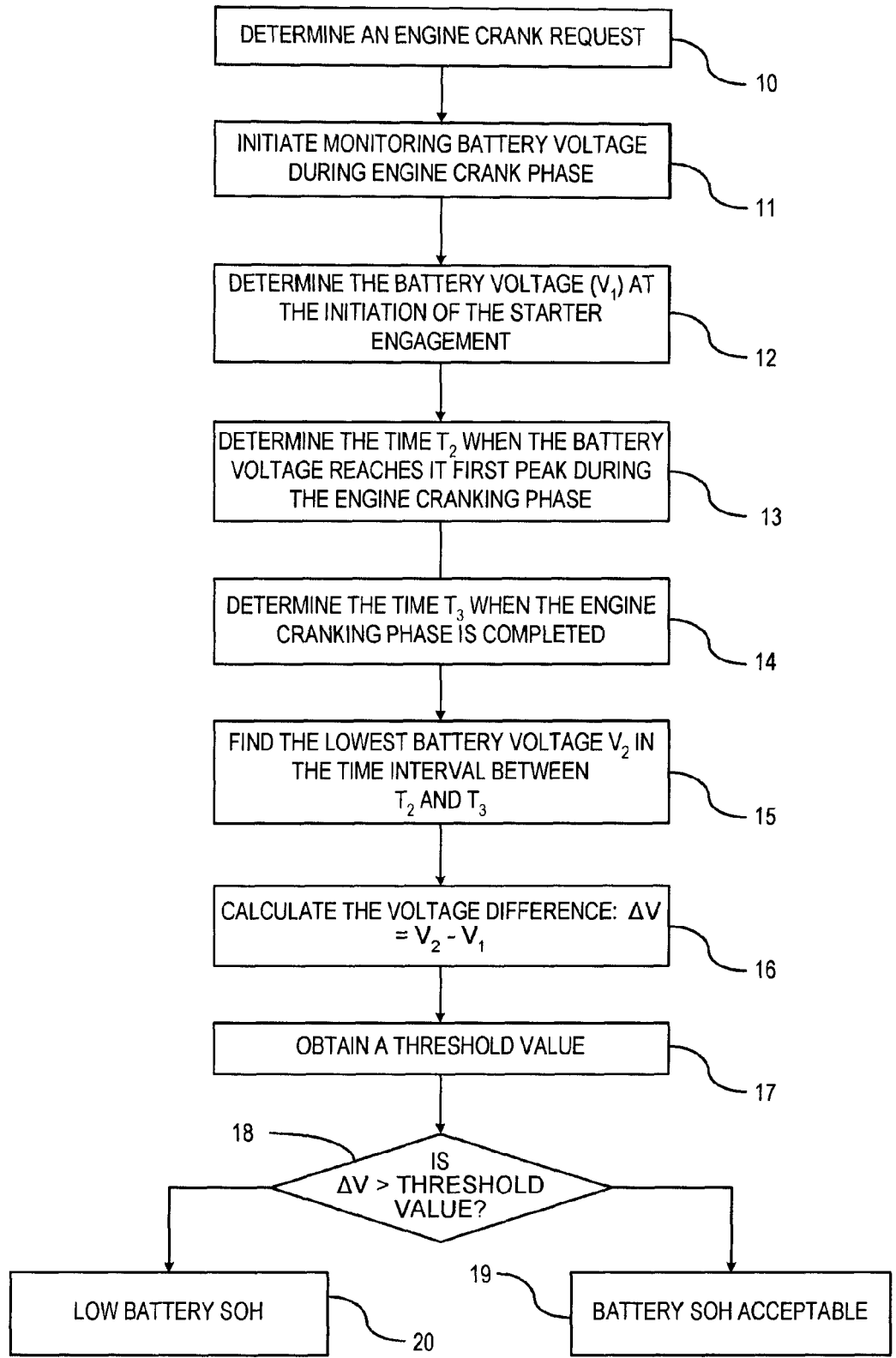
FIG. 1 is a flowchart of a method for determining a battery's state-of-health according to an embodiment

FIG. 1 illustrates a flowchart of a method for an embodiment for determining state-of-health of a battery in a vehicle. The method determines battery state-of-health by monitoring the battery voltage characteristics during an engine cranking phase. Comparing an initial battery voltage upon starter engagement to a minimum voltage acquired from the battery during the engine cranking phase provides the data for determining the battery's power capability.

In step 10, a determination is made as to whether an engine crank request is present. The engine crank request may be detected by monitoring the starter relay or other electrical device that provides a signal identifying the engine crank request. In step 11, the battery voltage is monitored during the entire engine cranking phase in response to detecting the presence of the engine crank request. In step 12, the battery voltage is recorded after a first voltage drop during the engine cranking process upon starter engagement. The first voltage drop typically occurs after power is provided to the starter coil for energizing the starter coil. This may be defined as an initial battery voltage $V_1$ at a time instant $T_1$.

In step 13, a determination is made when the monitored battery reaches a first peak value. This time value may be denoted as $T_2$. The first peak value may be determined by various methods. The issue that must be overcome is to avoid any ripple effects in the monitoring of the battery voltage as small decrements in the voltage may not necessarily constitute the first peak value. For example, a first method for determining the first peak value is determined when the battery voltage decreases by at least a predetermined value or a percentage of the initial voltage increase (i.e., the voltage increase from the initiation of the starter engagement to the potential peak). Another example for determining the peak value is to provide the monitored waveform in a window and contracting the window, and hence waveform, to smoothing the signal. This would eliminate ripple effects so that the first peak value may be determined. It is noted that the methods described above for determining the first peak value are examples and are not exclusive of other methods that may be used to determine the first peak value.

In step 14, a determination is made when the engine cranking phase is successfully completed. This time value is denoted as $T_3$. In step 15, a lowest battery voltage value $V_2$ is determined between the time when the first peak value is determined $T_1$ and the time when the engine cranking phase is successfully completed $T_2$. That is, the lowest battery voltage value $V_2$ is determined in the time interval between $T_2$ to $T_3$.

In step 16, a voltage difference $\Delta V$ is determined by subtracting the initial voltage $V_1$ from the lowest battery voltage $V_2$. In step 17, a voltage threshold is obtained. The voltage threshold may be a fixed voltage value or may be a voltage value obtained from a lookup table. The lookup table may include a plurality of battery voltage values having additional criteria for selecting a respective threshold value. Examples of additional criteria may include, but is not limited to, the temperature of the battery, the state-of-charge of the battery, or a combination of one or more criteria. For example, the temperature of the current vehicle battery may be monitored, and based on the current temperature, a threshold value contained in the lookup table associated with the current temperature recorded during vehicle starting is used.

In step 18, a determination is made whether the voltage difference $\Delta V$ is greater than a voltage threshold. If the determination is made that the voltage difference $\Delta V$ is greater than the voltage threshold, then in step 19, the SOH of the vehicle battery is considered to have sufficient power capability for starting. If the voltage difference $\Delta V$ is less than the voltage threshold, then in step 20, the battery is considered to have a low SOH. A warning indicator, including but not limited to, visual, audible, or tactile warning may be provided to the driver to indicate the current condition of the vehicle battery.

Figure 2:
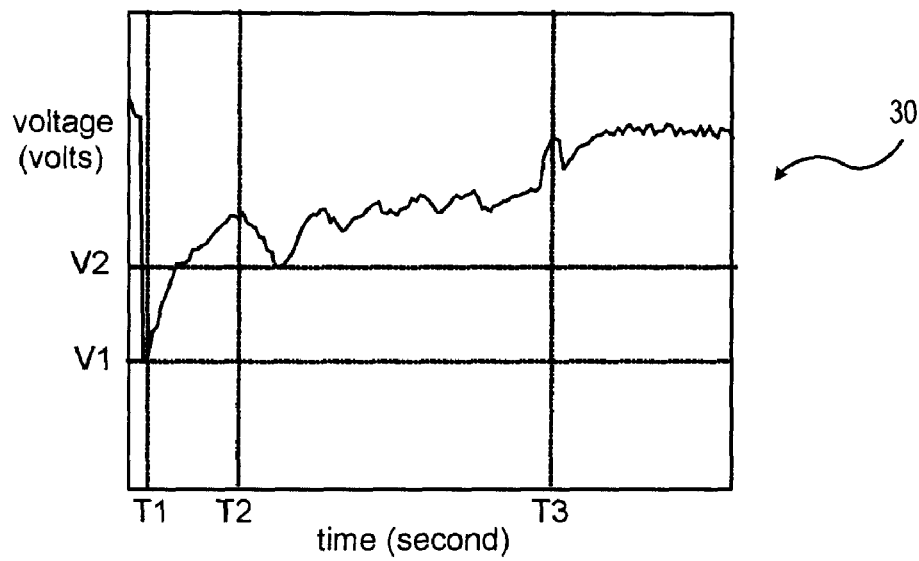
FIG. 2 is an example of a battery voltage waveform measured during an engine crank phase.

FIG. 2 illustrates a first example of a battery voltage waveform 30 measured during an engine crank phase. The battery voltage waveform, shown in FIG. 2, illustrates a vehicle battery having sufficient power capability for starting the vehicle. The time value $T_1$ illustrates the time of starter engagement. The initial voltage $V_1$ is measured at time $T_1$. $V_1$ is the voltage corresponding to the first voltage drop in response to energizing the starter coil. At time $T_2$, the battery voltage during the engine cranking phase reaches the first peak value.

Time instant $T_3$ represents the time when the engine cranking phase is complete. At time instant $T_3$, the starter motor disengages from the flywheel and power is no longer being provided to the starter motor. The lowest voltage $V_2$ is then obtained from the battery voltage waveform in the time interval between time instant $T_2$ and time instant $T_3$. The voltage difference $\Delta V$ is determined by subtracting the initial voltage $V_1$ from the lowest voltage $V_2$ and compared to the voltage threshold. For example, the voltage threshold is set to 0 based on a fixed number or from the lookup table based on one or more battery characteristics (e.g., temperature, state-of-charge). It should be understood that the threshold value 0 is used for exemplary purposes only and may be a value other than 0. Based on the battery voltage waveform, shown in FIG. 2, the voltage difference $\Delta V$ would result in a positive number since the lowest voltage $V_2$ is greater than the initial voltage $V_1$. Since voltage difference $\Delta V$ being a positive value would be greater than the voltage threshold of 0, the determination is made that the battery has sufficient power capability for starting and operating the vehicle.

Figure 3:
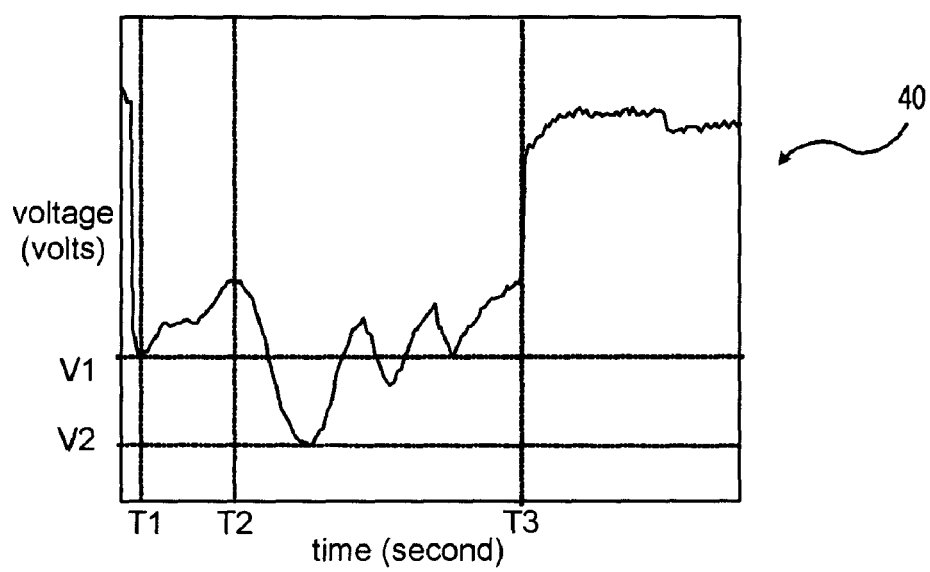
FIG. 3 is an example of a battery voltage waveform measured during an engine crank phase.

FIG. 3 illustrates a second example of a battery voltage waveform 40 measured during an engine crank phase. The battery voltage waveform, shown in FIG. 3, illustrates a vehicle battery having low (unacceptable) power capability. The time values $T_1$, $T_2$, $T_3$ are determined using the same process as described above in FIGS. 1-2. Similarly, the voltage values $V_1$, $V_2$ are determined using the same process described above. For FIG. 3, the voltage difference $\Delta V$ is determined by subtracting the initial voltage $V_1$ from the lowest voltage $V_2$ which results in a negative value. If the threshold value is set to 0 (i.e., for exemplary purposes only), then the voltage difference $\Delta V$ would be less than the threshold value. As a result, the determination is made that the battery has a low SOH. Warning indicators may then be actuated indicating the battery's SOH condition.

The embodiments described herein utilize characteristics of the battery voltage signal during vehicle starting to determine battery SOH. As a result, the cost is minimized as a high current sensor is not required. Moreover, since the battery end-of-life is determined based on respective features of the battery voltage signal during vehicle starting, the time and cost to calibrate the state-of-health algorithm are reduced.

While certain embodiments of the present invention have been described in detail, those familiar with the art to which this invention relates will recognize various alternative designs and embodiments for practicing the invention as defined by the following claims.

What is claimed is:

1. A method of determining a state-of-health of a battery, the method comprising the steps of:
measuring an initial battery voltage after a first voltage drop during an initiation of an engine cranking phase;
monitoring a battery voltage during the remainder of the engine cranking phase;
determining a first peak voltage after the first voltage drop;
determining a lowest battery voltage during an interval between the first peak voltage and completion of the engine cranking phase;
determining if a voltage difference between the lowest battery voltage and the initial battery voltage is less than a voltage threshold; and
identifying a low battery state-of-health in response to the voltage difference being less than the voltage threshold.

2. The method of claim 1 wherein the lowest battery voltage is a lowest voltage value measured after the voltage of the battery reaches a first peak voltage and prior to the completion of the engine cranking phase.

3. The method of claim 1 wherein measuring a battery voltage at an initiation of an engine cranking phase occurs substantially simultaneously at starter engagement.

4. The method of claim 1 wherein the voltage threshold includes a fixed voltage value.

5. The method of claim 1 wherein the threshold voltage is obtained from a lookup table based on a temperature of the battery.

6. The method of claim 1 wherein the threshold voltage is obtained from a lookup table based on a state-of-charge of the battery.

7. The method of claim 1 wherein the threshold voltage is obtained from the lookup table based on a temperature of the battery and a state-of-charge of the battery.

8. A method of determining a state-of-health of a battery, the method comprising the steps of:

measuring an initial battery voltage during an initiation of the engine cranking phase;

determining a first voltage peak during the engine cranking phase;

determining a lowest voltage between a time when the first voltage peak is detected and completion of the engine cranking phase;

determining a voltage difference between the lowest voltage and the initial battery voltage;

comparing the voltage difference to a voltage threshold;

determining a low battery state-of-health if the voltage difference is less than the voltage threshold; and generating an indication of the low battery state-of-health in response to the voltage difference being less than the voltage threshold.

9. The method of claim 8 wherein comparing the voltage difference to a voltage threshold includes comparing the voltage difference to a fixed voltage value.

10. The method of claim 8 wherein the voltage threshold is retrieved from the lookup table based on a temperature of the battery.

11. The method of claim 8 wherein the voltage threshold is retrieved from the lookup table based on a state-of-charge of the battery.

12. The method of claim 8 wherein the voltage threshold is retrieved from the lookup table based on a temperature of the battery and a state-of-charge of the battery.

13. The method of claim 8 wherein lowest voltage is a lowest voltage value measured after the voltage of the battery reaches a first peak voltage and prior to the completion of the engine cranking phase.

14. The method of claim 8 wherein measuring the initial battery voltage occurs after a first voltage drop during an initiation of the engine cranking phase.

15. The method of claim 8 wherein measuring a battery voltage at an initiation of an engine cranking phase occurs substantially simultaneously with a starter engagement.

\* \* \* \* \*